US008766099B2

(12) United States Patent
Yeates

(10) Patent No.: US 8,766,099 B2
(45) Date of Patent: Jul. 1, 2014

(54) COMPONENT MOUNTING STRUCTURES FOR ELECTRONIC DEVICES

(75) Inventor: Kyle H. Yeates, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 356 days.

(21) Appl. No.: 12/569,871

(22) Filed: Sep. 29, 2009

(65) Prior Publication Data

US 2011/0075384 A1    Mar. 31, 2011

(51) Int. Cl.
| | |
|---|---|
| H05K 1/00 | (2006.01) |
| H05K 1/03 | (2006.01) |
| H05K 1/16 | (2006.01) |
| H05K 5/00 | (2006.01) |
| H05K 7/00 | (2006.01) |
| H05K 1/18 | (2006.01) |

(52) U.S. Cl.
USPC ........... 174/254; 174/255; 174/260; 361/752; 361/760; 361/761

(58) Field of Classification Search
USPC ......... 361/807, 809, 810, 752, 760, 761, 770, 361/749–751, 758, 759; 174/254, 255, 260, 174/252, 262–266, 250
See application file for complete search history.

(56) References Cited

U.S. PATENT DOCUMENTS

| | | | | |
|---|---|---|---|---|
| 4,054,938 | A * | 10/1977 | Morris, Sr. | 361/764 |
| 5,109,320 | A | 4/1992 | Bourdelaise et al. | |
| 5,326,937 | A * | 7/1994 | Watanabe | 174/263 |
| 5,414,223 | A * | 5/1995 | Suski et al. | 174/262 |
| 5,420,378 | A * | 5/1995 | Estes et al. | 174/263 |
| 5,453,580 | A * | 9/1995 | Franke et al. | 174/250 |
| 5,519,201 | A | 5/1996 | Templeton, Jr. et al. | |
| 5,736,679 | A * | 4/1998 | Kresge et al. | 174/250 |
| 5,766,972 | A | 6/1998 | Takahashi et al. | |
| 6,069,548 | A * | 5/2000 | Baarman et al. | 336/65 |
| 6,094,984 | A * | 8/2000 | Asano et al. | 73/493 |
| 6,233,816 | B1 * | 5/2001 | Franke et al. | 29/829 |
| 6,295,210 | B1 * | 9/2001 | Lanzone et al. | 361/799 |
| 6,296,494 | B1 * | 10/2001 | Yuasa et al. | 439/67 |
| 6,328,598 | B1 * | 12/2001 | Harris, Jr. | 439/516 |
| 6,418,028 | B2 * | 7/2002 | Nariyama | 361/759 |
| 6,771,517 | B2 * | 8/2004 | Crapisi et al. | 361/829 |
| 7,005,585 | B2 * | 2/2006 | Ishizaki | 174/260 |
| 7,181,968 | B2 * | 2/2007 | Still | 73/493 |
| 7,288,725 | B2 * | 10/2007 | Takeuchi et al. | 174/260 |
| 7,348,497 | B2 * | 3/2008 | Kawauchi et al. | 174/260 |
| 2007/0184675 | A1 * | 8/2007 | Ishikawa | 439/61 |
| 2008/0105455 | A1 * | 5/2008 | Palfreyman et al. | 174/254 |
| 2009/0034214 | A1 * | 2/2009 | Kao et al. | 361/752 |
| 2009/0086450 | A1 * | 4/2009 | Matsui | 361/761 |
| 2009/0219703 | A1 * | 9/2009 | Ishii et al. | 361/753 |

FOREIGN PATENT DOCUMENTS

EP    0 488 574 B1    11/1995

* cited by examiner

*Primary Examiner* — Jeremy C Norris
*Assistant Examiner* — Sherman Ng
(74) *Attorney, Agent, or Firm* — Treyz Law Group; G. Victor Treyz; Kendall P. Woodruff

(57) ABSTRACT

Sensitive electronic components can be mounted on a printed circuit board within an electronic device. To isolate a sensitive component from stresses that may arise during an unintended impact event, the electronic component can be isolated using a groove in the printed circuit board. The electronic component may be mounted to a component mounting region using solder balls. The component mounting region may be surrounded on some or all sides by the groove. Flex circuit structures that bridge the groove or a portion of the rigid printed circuit board may be used to hold the component mounting region in place. The flex circuit structures may be provided in the form of separate structures or may be provided as an integral portion of the printed circuit board.

8 Claims, 21 Drawing Sheets

COMPONENT MOUNTING STRUCTURES FOR ELECTRONIC DEVICES

BACKGROUND

This relates to electronic devices, and more particularly, to electronic devices with component mounting structures that help the electronic devices withstand damage when subjected to stress.

Electronic devices such as computers, media players, and cellular telephones typically contain electronic components. For example, a handheld electronic device might contain an accelerometer module that is used in determining the orientation of the handheld electronic device with respect to ground (e.g., whether the device is in landscape or portrait mode). Accelerometers and other electronic components such as integrated circuits, microphones, speakers, status indicators, and connectors for input-output ports, are typically mounted on printed circuit boards. Conductive traces on the printed circuit boards are used to route signals between the components.

Components are often mounted to printed circuit boards using solder balls. For example, a "flip-chip" arrangement may be used to mount an integrated circuit to a printed circuit board. With this type of configuration, an array of solder bumps is interposed between the integrated circuit and the printed circuit board. The solder bumps serve to electrically connect the circuitry of the integrated circuit to the printed circuit board. The solder bumps also serve to physically attach the integrated circuit to the printed circuit board. Components such as accelerometers may also be mounted in this way.

Electronic devices and the electrical components within these devices are sometimes exposed to large stresses. For example, a user of a device may inadvertently drop the device on the ground. When the device strikes the ground, the printed circuit board and the components mounted to the printed circuit board are subjected to stress. If the stress is too great, components may become partly or fully detached from the printed circuit board or may become damaged due to internal stresses.

One way in which to enhance the robustness of a typical solder ball component mounting scheme involves the use of epoxy underfill. During manufacturing, liquid epoxy is introduced into the gap between a component and the printed circuit board to which the component is mounted. Capillary action draws the epoxy between the component and the printed circuit board. The epoxy is then cured, which helps stabilize the mounted component and prevent inadvertent detachment of the component during a drop event.

Underfill arrangements are often satisfactory when mounting robust components to a printed circuit board. However, underfill arrangements are not satisfactory for use with sensitive components such as accelerometers. When components such as these are underfilled, the presence of the underfill disrupts proper operation of the component. Proper operation can be ensured by omitting the underfill when mounting the components, but this tends to increase the risk of component failure during a drop event.

It would therefore be desirable to be able to provide electronic devices with improve component mounting structures.

SUMMARY

An electronic device may have a housing. One or more printed circuit boards may be mounted within the housing. Components may be mounted on the printed circuit board using solder balls. For example, sensitive electronic components such as accelerometers may be mounted to a component mounting region using solder balls. The component mounting region may be separated from other portions of the printed circuit board using an isolating groove. The groove may be formed from an air-filled opening in the printed circuit board. The groove may surround all or part of the component mounting region.

To form electrical connections between the component that is mounted to the component mounting region and other circuitry on the printed circuit board, traces may be formed on a portion of the printed circuit board that connects the component mounting region to the rest of the printed circuit board. Flex circuit and rigid flex arrangements may also be used to interconnect the component mounting region to the printed circuit board. If desired, a flex circuit layer may be sandwiched between patterned layers of rigid printed circuit board material to form an integral mounting structure.

Further features of the invention, its nature and various advantages will be more apparent from the accompanying drawings and the following detailed description of the preferred embodiments.

DETAILED DESCRIPTION

Figure 1:
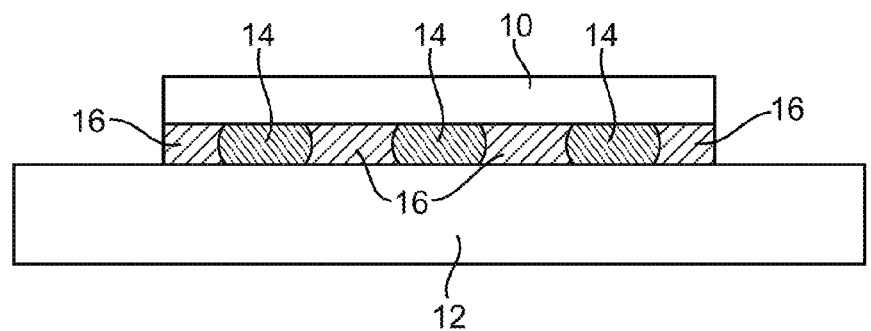
FIG. 1 is a cross-sectional side view of a conventional printed circuit board on which a component has been mounted and underfilled with epoxy.

Electronic devices often contain one or more printed circuit boards. For example, an electronic device may include one or more rigid printed circuit boards and one or more flexible printed circuit boards. Rigid printed circuit boards are formed using rigid printed circuit board substrates such as fiberglass-filled epoxy. Flexible printed circuit boards ("flex circuits") are formed using flexible printed circuit board substrates such as substrates based on thin flexible polymer films. A typical flex circuit substrate material is polyimide. Hybrid boards of "rigid flex" are also sometimes used. A printed circuit board that is formed from rigid flex has both flexible and rigid portions. The flexible portions are formed from flex circuit. The rigid portions are formed from the same flex circuit, but include additional rigid printed circuit board layers.

Printed circuit boards contain patterned conductive traces formed from copper or other conductive materials. The conductive traces can be used as data signal and power wires for electrical components that are mounted to the printed circuit boards.

In a typical electronic device, for example, a circuit board may be used to mount a microprocessor, a memory chip, audio chips, communications circuits, application-specific integrated circuits, digital signal processing circuits, power management circuits, and other integrated circuits. Discrete components such as resistors, inductors, and capacitors can also be mounted on the printed circuit board. Microphones, speakers, light-emitting diodes, and sensors such as light and pressure sensors are additional examples of components that may be mounted on a printed circuit board. To facilitate connections with other boards in the device and peripheral components, connectors may be mounted on a printed circuit board. Non-electrical features such as plastic posts can be mounted to the board among the electrical components.

Some components on a printed circuit board are relatively robust. For example, a connector may be formed from a metal part such as a stainless steel bracket. The bracket and other portions of the connector may be formed from sturdy materials that can withstand the forces typically associated with use of the connector.

Other components on a printed circuit board may be sensitive. An example of a sensitive component is an accelerometer formed using microelectromechanical systems (MEMS) technology. An accelerometer is sometimes used to detect the orientation of an electronic device. For example, an accelerometer may be used to measure the direction of the earth's gravity and thereby determine which direction is "up" relative to the surface of the earth. Accelerometers are considered "sensitive" because accelerometers will not produce accurate results in the presence of excessive stress. Care must therefore be taken when mounting an accelerometer on a printed circuit board.

Accelerometers and other MEMS components are generally mounted in packages. A typical package may have a rectangular (box) shape and may have exposed pads on its underside. These pads may be connected to traces on a printed circuit board using solder balls. Component mounting arrangements that rely solely on solder balls may not be sufficiently robust to withstand the stresses that are encountered during normal use of an electronic device. For example, a user of an electronic device may inadvertently drop the electronic device. Drop events and other abrupt stress-inducing events can dislodge weakly mounted components from printed circuit boards, leading to undesired failures.

To help stabilize component packages on printed circuit boards and thereby enhance the ability of the components to withstand stresses, components are often stabilized using an underfill process. A conventional underfill arrangement is shown in FIG. 1. As shown in FIG. 1, component 10 may be mounted on printed circuit board 12 using solder balls 14. Component 10 may be, for example, an integrated circuit. To enhance the robustness of the mounting arrangement, epoxy 16 may be introduced around the periphery of component 10. Through capillary action, the epoxy may wick into the gap between the underside of component 10 and the upper surface of printed circuit board 12. Following curing, this epoxy will form a strong bond that will help hold component 10 on circuit board 12.

Although conventional underfill arrangements of the type shown in FIG. 1 are satisfactory for mounting integrated circuits to printed circuit boards, difficulties arise when mounting sensitive components such as accelerometers. This is because the underfill process itself introduces stresses that can cause the accelerometer to perform poorly.

This problem with conventional underfill arrangements can be addressed using component isolation structures based on the formation of one or more grooves in a printed circuit board. These grooves, which are also sometimes referred to as channels, holes, or air-filled openings, can be used to reduce the amount of stress that is transferred from an electronic device housing to the portion of the circuit board on which the accelerometer or other component is mounted. With this type of isolation scheme, stresses that arise from inadvertent drop events are attenuated before they affect the component. Because the amount of stress that is transmitted to the component during a drop event or other impact event is reduced, the need to underfill the component is eliminated or reduced.

Component mounting structures with isolation features may be formed on any suitable type of printed circuit board. Most typically, at least some of the printed circuit board is formed from a rigid substrate. Examples in which rigid printed circuit substrates are provided with isolation grooves are therefore sometimes described as an example. This is, however, merely illustrative. Isolation structures may be formed in any suitable substrate. Moreover, the type of component that is isolated using the isolation structures need not be an accelerometer. Any suitable components may be isolated using the isolation structures. The formation of isolation structures suitable for isolating sensitive electrical components such as accelerometers or other components constructed using MEMS technology is merely illustrative.

Component mounting structures with isolation features such as printed circuit board grooves can be used in desktop computers, televisions, and other relatively large electronic devices. Because portable electronic devices are more often subject to unwanted impacts, it may be advantageous to form component mounting structures with isolation features in the printed circuit boards that are used in portable electronic devices. As an example, the component mounting structures may be used in connection with printed circuit boards in laptop computers, tablet computers, cellular telephones, media players, global positioning system units, gaming devices, handheld computers, wristwatch or pendant devices, or other portable computing equipment.

Figure 2:
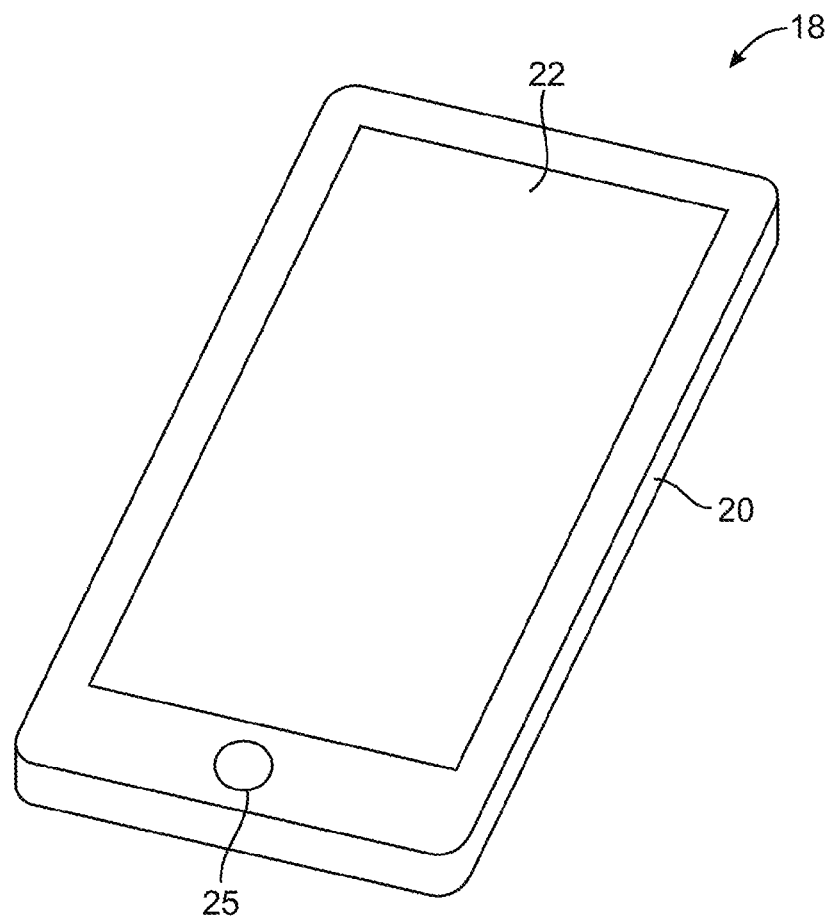
FIG. 2 is a perspective view of an illustrative electronic device that may include a component mounting structure in accordance with an embodiment of the present invention.

An illustrative electronic device that may include component isolation structures is shown in FIG. 2. As shown in FIG. 2, electronic device 18 may include a housing 20. Housing 20, which is sometimes referred to as a case, may be formed from metal, composites, plastic, other suitable materials, or combinations of these materials. Components such as display 22 and input-output devices such as button 25 may be mounted in housing 20.

Figure 3:
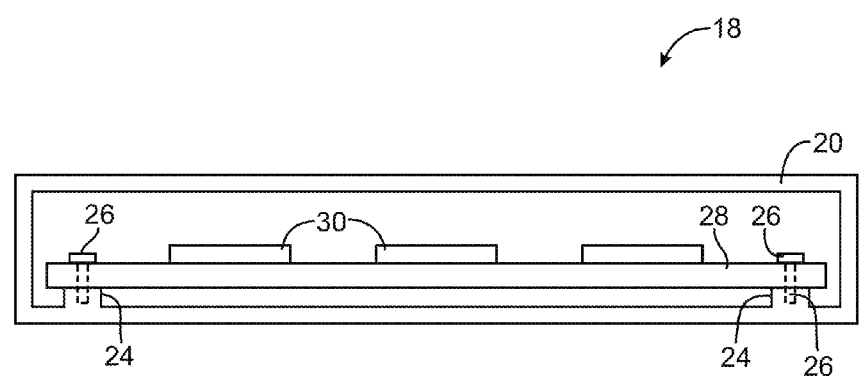
FIG. 3 is a cross-sectional side view of an illustrative electronic device showing how an accelerometer and other components may be mounted on a substrate such as a printed circuit board within the electronic device in accordance with an embodiment of the present invention.

The interior of housing 20 may be used to house printed circuit boards, electronic components, batteries, etc. A cross-sectional side view of a typical device such as device 18 of FIG. 2 is shown in FIG. 3. As shown in FIG. 3, printed circuit board 28 may be mounted on housing portions such as posts 24 using screws such as screws 26. Printed circuit board 28 may have holes through which screws 26 pass. Posts 24 may have threaded bores that receive the threaded ends of screws 26. When screws 26 are tightened, printed circuit board 28 may be held against posts 24 and thereby secured in the interior of device housing 20.

Components 30 may be mounted on printed circuit boards 28 using solder balls. This type of component mounted arrangement is sometimes referred to as ball grid array (BGA) packaging or flip-chip mounting. Although solder balls tend to form good electrical connections between the conductive pads of components 30 and the mating conductive traces on printed circuit board 28, solder ball joints can fail when subjected to excessive stress.

Figure 4:
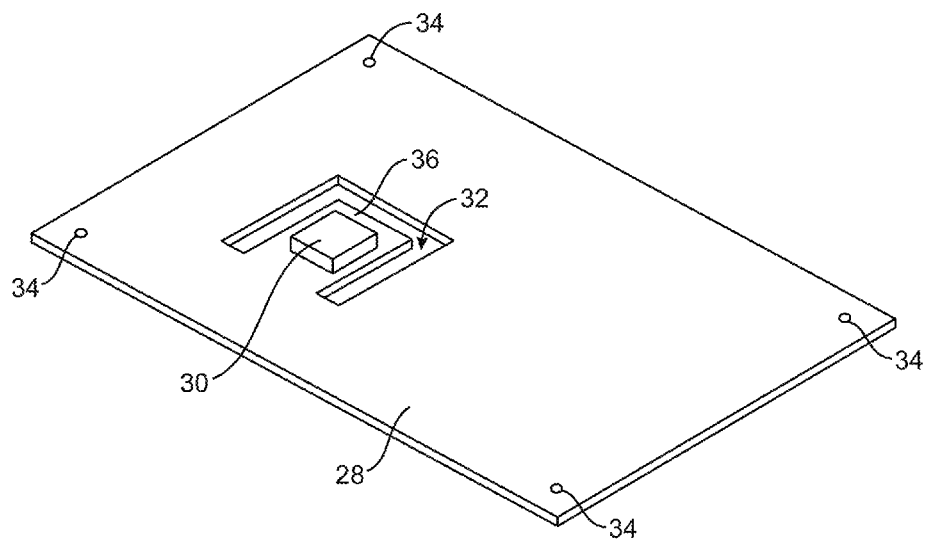
FIG. 4 is a perspective view of an illustrative printed circuit board with an isolation groove surrounding a component on the board in accordance with an embodiment of the present invention.

Stress levels can be reduced by forming grooves around some or all of a given component. An isolation structure of this type is shown in FIG. 4. As shown in FIG. 4, component 30 may be mounted on printed circuit board 28. Holes 34 in printed circuit board 28 may be used to accommodate screws 26 (FIG. 3). Isolation groove 32 is formed around some or all of component 30. This reduces the mechanical coupling between the peripheral portions of printed circuit board 28 (e.g., the corners near holes 34 where an impact event is felt) and the portion of printed circuit board on which component 30 is mounted (e.g., component mounting region 36 in the example of FIG. 4). The reduction in mechanical coupling between the edges of board 28 and component mounting region 36 isolates component 30 from stress and helps reduce or eliminate the need for underfill.

It is not necessary to form groove 32 around all four edges of component 30. In the FIG. 4 example, three of the four sides of component 30 are isolated by respective segments of groove 32. This is, however, merely illustrative.

Figure 5:
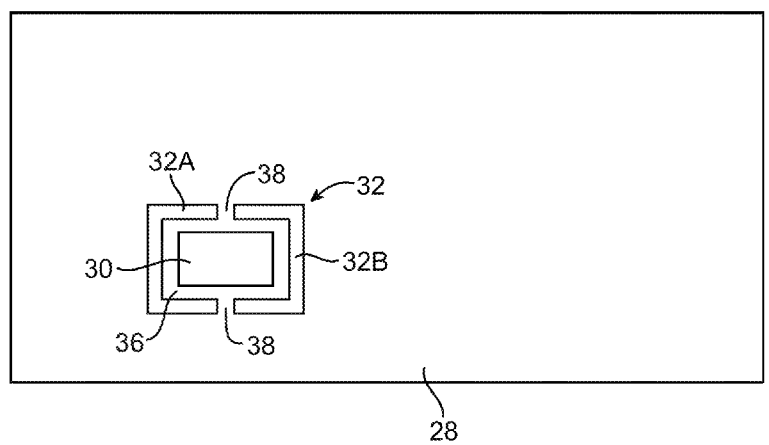
FIG. 5 is a top view of an illustrative printed circuit board with a pair of isolation grooves for isolating a component on the board in accordance with an embodiment of the present invention.

An illustrative configuration in which groove 32 has too distinct segments (32A and 32B) is shown in FIG. 5. In this example, groove portion 32A covers the right-hand side of component 30 and groove portion 32B covers the left-hand side of component 30. Grooves 32A and 32B also each have small extending arms that run partway along the upper and lower edges of component 30 to help maximize isolation. Grooves 32A and 32B of FIG. 5 (and the other grooves described herein) are typically devoid of material (i.e., the grooves are air filled). Flexible membranes or other pliable materials may, if desired, be used to fill some or all of the grooves, although this will tend to reduce mechanical isolation. The portions of board 28 that are not removed (i.e., the upper and lower portions 38 in FIG. 5 that remain in the regions between the gaps in groove 32) hold component mounting portion 36 of printed circuit board 28 in place.

Figure 6:
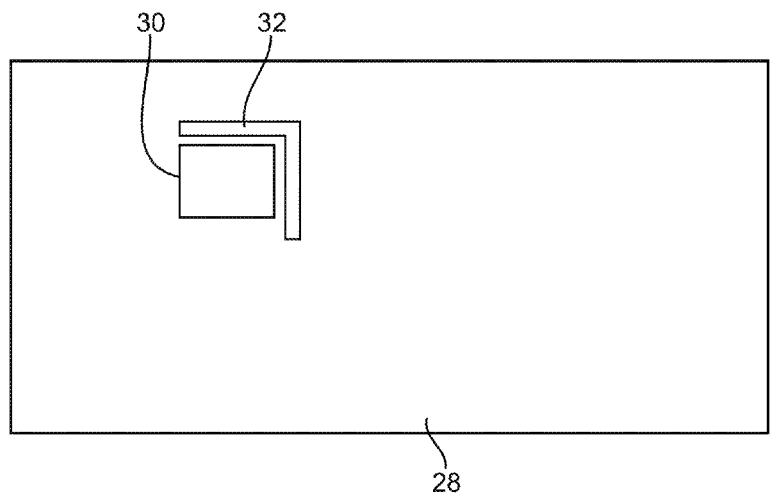
FIG. 6 is a top view of an illustrative printed circuit board with an L-shaped isolation groove for isolating a component on the board in accordance with an embodiment of the present invention.

In some configurations, it may not be desirable to form grooves around the entire periphery of component 30. In this type of situation, an L-shaped groove such as groove 32 of FIG. 6 may be used (as an example).

Figure 7:
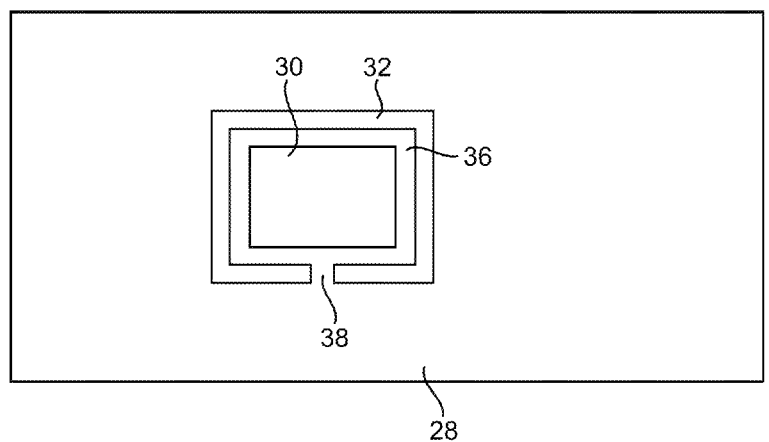
FIG. 7 is a top view of an illustrative printed circuit board with a U-shaped isolation groove for isolating a component that is substantially surrounded by the groove in accordance with an embodiment of the present invention.

FIG. 7 shows an illustrative arrangement in which only a relatively small amount of printed circuit board material remains in region 38 between the two opposing ends of groove 32. This helps maximize the isolation of inner board portion 36 (and component 30) from the rest of board 28, although less material is available for holding inner region 36 in place.

Figure 8:
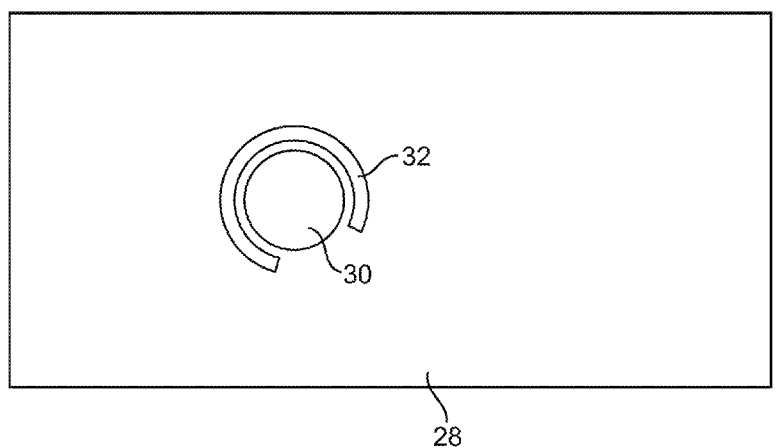
FIG. 8 is a top view of an illustrative printed circuit board with a curved isolation groove for isolating a component on a printed circuit board in accordance with an embodiment of the present invention.

Groove 32 need not be straight. For example, groove 32 may form a circular arc shape, as shown in FIG. 8. FIG. 8 also shows how component 30 need not be rectangular. In general, groove 32 and component 30 can have any suitable shapes with curve edges, straight edges, combinations of curved and straight edges, etc.

Figure 9:
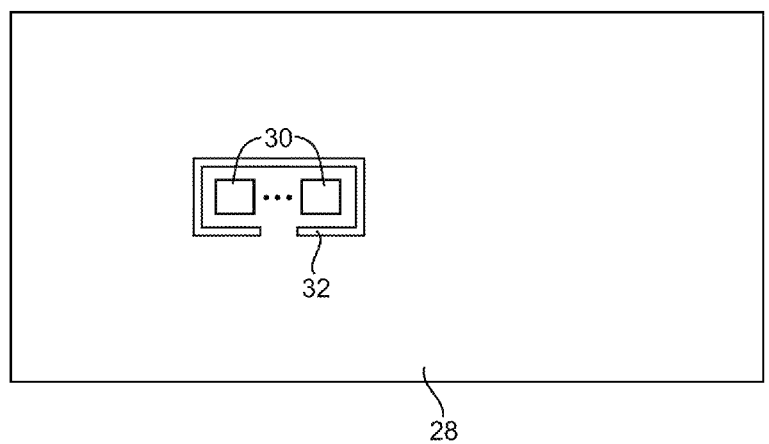
FIG. 9 is a top view of an illustrative printed circuit board in which multiple components have been provided with isolation using a groove in the printed circuit board in accordance with an embodiment of the present invention.

As shown in FIG. 9, multiple components 30 may be isolated within the same isolating opening in printed circuit board 28. In the FIG. 9 example, there may be two or more components that are surrounded by a single groove 32. When isolating multiple components in this way, groove 32 may have a curved shape, may have one or more separate segments, may extend partly around component 30, may extend around substantially all of component 30, or may use other suitable groove configurations.

Figure 10:
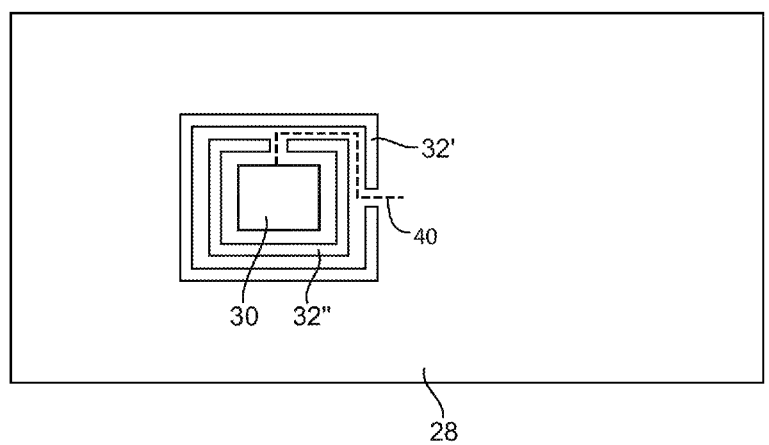
FIG. 10 is a top view of an illustrative printed circuit board in which a component has been isolated by multiple concentric grooves in the printed circuit board in accordance with an embodiment of the present invention.

To provide additional isolation for component 30, multiple grooves may be nested within each other. An example of a configuration in which multiple nested grooves 32 are used to isolate a component is shown in FIG. 10. As shown in FIG. 10, component 30 may be isolated using outer groove 32' and inner groove 32". Electrical connections to component 30 may be made using printed circuit board traces 40. Traces 40 of FIG. 10 and the other traces on printed circuit board 28 may be formed on the surface of printed circuit board 28 and in one or more buried interconnect layers. Copper, gold, copper plated with gold, and other metals and conductive materials may be used in forming printed circuit board traces such as traces 40. To accommodate solder ball connections, parts of the ends of traces 40 (i.e., the portions under component 30) may be patterned to form an array of square contact pads or other suitable contact pad structures. Mating contacts may be formed on the underside of component 30.

Figure 11:
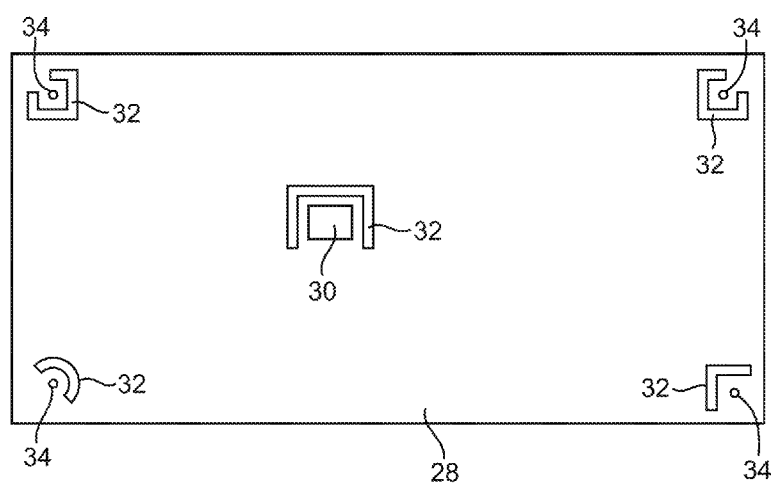
FIG. 11 is a top view of an illustrative printed circuit board in which component isolation has been provided using grooves surrounding printed circuit board mounting posts and a groove adjacent to a mounted component on the printed circuit board in accordance with an embodiment of the present invention.

FIG. 11 shows how isolation grooves 32 may be used to isolate the corners of board 28. These grooves may be rectangular, may have L-shapes, may have curved shapes, or may have any other suitable shapes. Each corner isolation groove may surround or isolate a separate screw hole 34. When isolation structures (i.e., grooves 32) are used to isolate screw holes 34, the entire interior surface of board 28 may be isolated from stress. It may therefore not be necessary to separately isolate component 30 using a groove. As shown in the FIG. 11 example, however, additional isolation may be provided by surrounding some or all of component 30 with a groove (groove 32) while using grooves 32 in the corners of board 28 to simultaneously provide isolation from screw holes 34.

Figure 12:
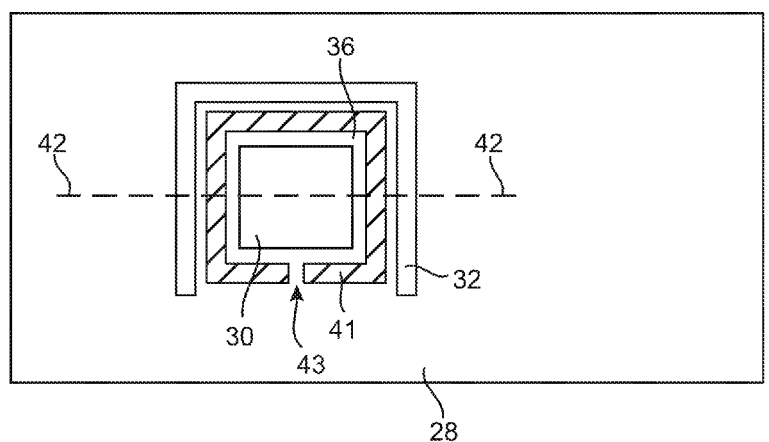
FIG. 12 is a top view of an illustrative component isolation arrangement in which a component that has been mounted on a printed circuit board is isolated using a groove formed in the printed circuit board and using a rigid ring-shaped stiffening structure on the surface of the printed circuit board in accordance with an embodiment of the present invention.

Mechanical isolation (stress reduction) can also be provided by adding mechanical stiffening members to board 28. An illustrative configuration of this type is shown in the top view of board 28 in FIG. 12. As shown in FIG. 12, rigid stiffing structure 41 may be formed around some or all of component 30. Rigid stiffening structure 41 may have a ring shape (e.g., a rectangular or circular ring shape). A gap such as gap 43 may be used to accommodate traces. Other configurations, such as configurations in which rigid stiffening structure 41 has multiple segments or different shapes may also be used. Rigid stiffening structure 41 may be formed from ceramic, glass, metal (e.g., stainless steel), printed circuit board material, or other stiff materials that can provide increased rigidity and strength to the vicinity of the portion of printed circuit board 28 on which component 30 is mounted. Stiffening structure 41 may be used in place of groove 32 or, as shown in FIG. 12, may be used in connection with groove 32.

Figure 13:
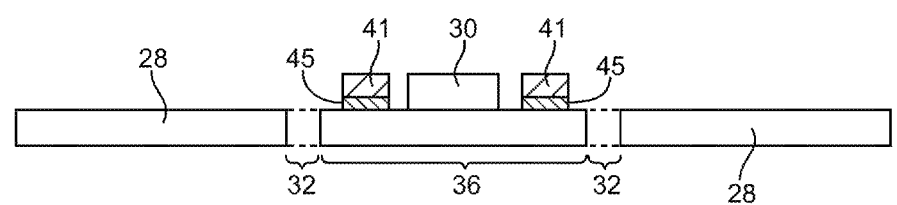
FIG. 13 is a cross-sectional side view of an illustrative component isolation arrangement of the type shown in FIG. 12 in which a component that has been mounted on a printed circuit board is isolated using a groove formed in the printed circuit board and using a rigid ring-shaped stiffening structure on the surface of the printed circuit board in accordance with an embodiment of the present invention.

A cross-sectional side view of the component isolation structures of FIG. 12 taken along line 42-42 of FIG. 12 is shown in FIG. 13. As shown in FIG. 13, component 30 may be mounted on inner printed circuit board component mounting region 36. Region 36 of FIG. 13 (and the other FIGS.) may be formed from a rigid rectangular sheet of printed circuit board material, a rectangular region of flex circuit, or other suitable mounting structures. Groove 32 may form an isolating gap between region 36 and the remainder of printed circuit board 28. Stiffening structure 41 may be connected to portion 36 adjacent to component 30 using adhesive 45 (e.g., pressure sensitive adhesive).

A flex circuit or rigid flex structure may be used to mount component 30. With this type of arrangement, flexible polymer portions of the flex circuit or rigid flex can bridge groove 32 without introducing significant mechanical coupling between interior printed circuit board region 36 and exterior region 28.

Figure 14:
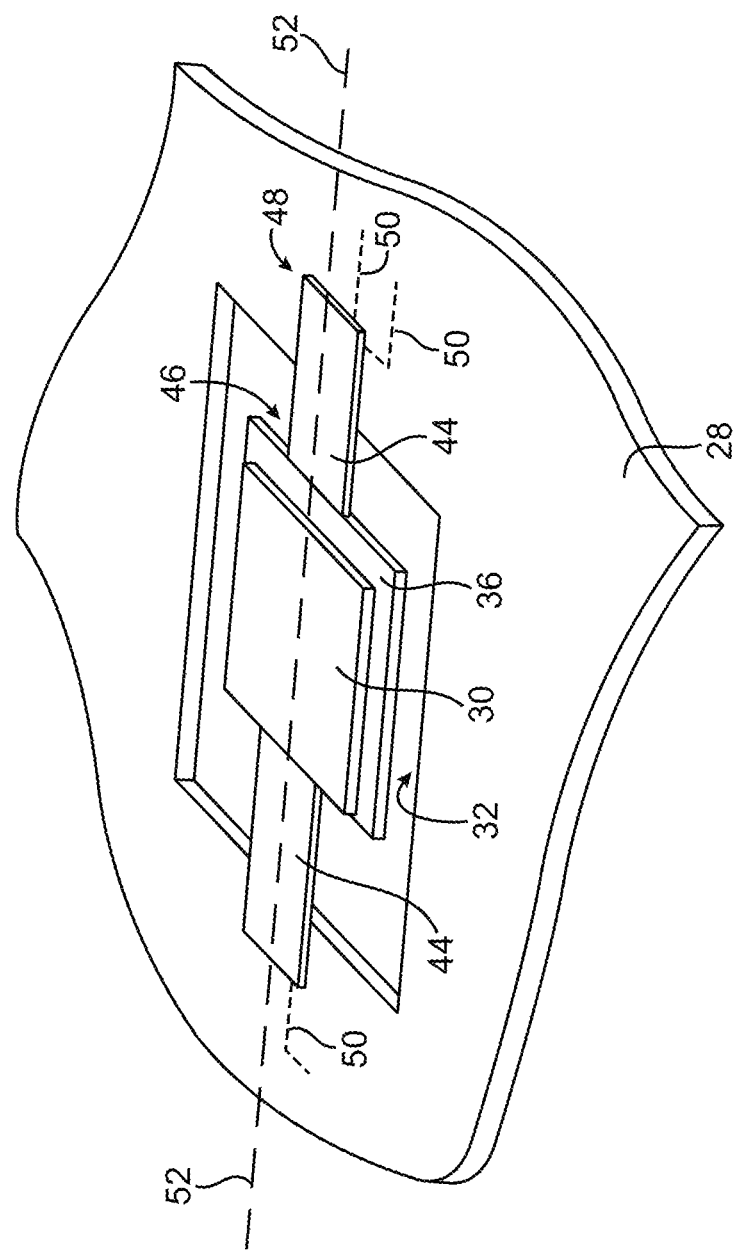
FIG. 14 is a perspective view of an illustrative component mounted within a hole in a printed circuit board using a rigid flex structure in accordance with an embodiment of the present invention.

An illustrative mounting arrangement that is based on use of rigid flex is shown in FIG. 14. As shown in FIG. 14, component 30 may be mounted on rigid portion 36 of a rigid flex member. Flexible (flex circuit) tails 44 may from integral portions of the rigid flex member and may extend outwardly from inner layers in rigid printed circuit board portion 36. Flexible tails 44 may contain conductive lines (traces). At the inner ends of tails 44 (i.e., at end 46 of the right-hand tail in FIG. 14), the conductors in the tails may make contact with interconnect conductors in rigid portion 36. At the outer ends of tails 44 (i.e., at end 48 of the right-hand tail in FIG. 14), the conductors in the tails may make contact with traces 50 on printed circuit board 28. Electrical connection between flex tails 44 and traces 50 may be make using connectors, conductive pressure sensitive adhesive, etc.

Figure 15:
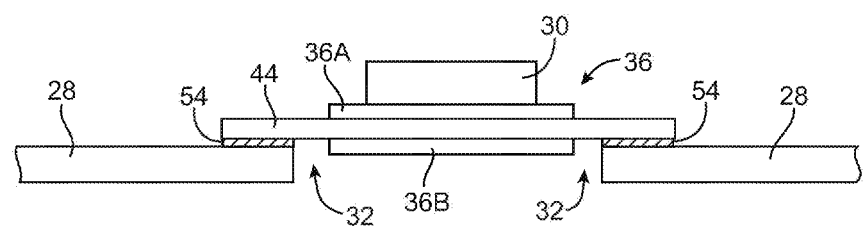
FIG. 15 is a cross-sectional side view of an illustrative component of the type shown in FIG. 14 mounted within a hole in a printed circuit board using a rigid flex structure in accordance with an embodiment of the present invention.

A cross-sectional side view of the component isolation structures taken along line 52-52 of FIG. 14 is shown in FIG. 15. As shown in FIG. 15, flex circuit tail sections 44 of the rigid flex may be used to bridge groove 32. Rigid printed circuit board portion 36 may include one or more rigid upper board layers such as layer(s) 36A and one or more rigid lower board layers such as layer(s) 36B. One or more layers of flex circuit are sandwiched between layers 36A and 36B and have tails 44 that extend outwardly across groove 32. Conductive adhesive 54 may be used to form a pattern of contacts at the ends of tails 44. These contacts may electrically interconnect the conductive flex circuit traces of tails 44 to corresponding traces on printed circuit board 28.

Figure 16:
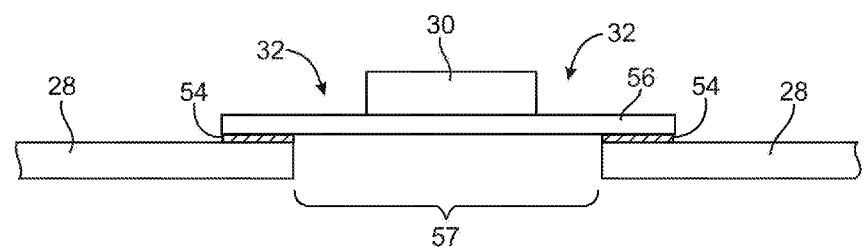
FIG. 16 is a cross-sectional side view of an illustrative component mounted within a hole in a printed circuit board using a flex circuit that bridges the hole in accordance with an embodiment of the present invention.

If desired, a flex circuit may be used as a mounting structure for component 30 (i.e., without using rigid printed circuit board portions as in a rigid flex scenario). As shown in the cross-sectional side view of FIG. 16, for example, flex circuit 56 may be used to form a mounting structure for component 30. Opening 57 may be, for example, a rectangular opening in printed circuit board 28. Flex circuit 56 may hold component 30 in place within opening 57. In this configuration, flex circuit 56 bridges opening 57 and thereby bridges groove 32, as shown in FIG. 16.

Figure 17A:
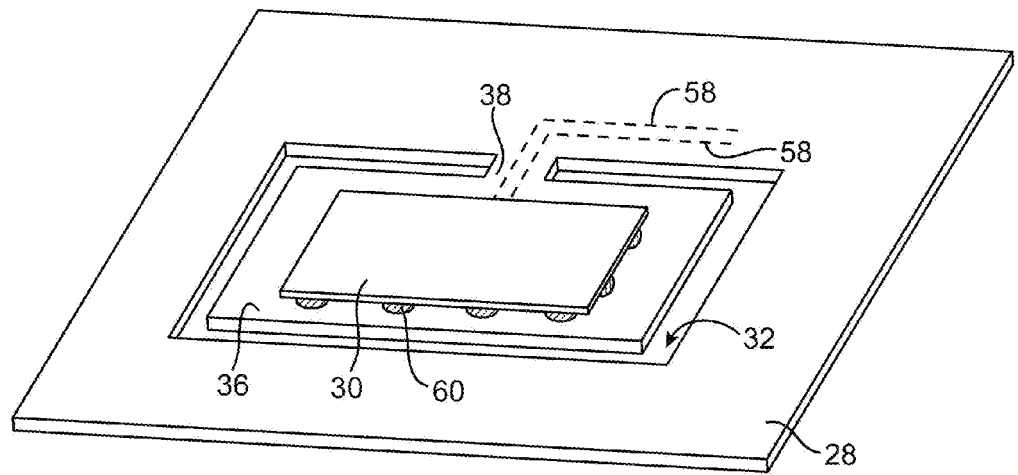
FIG. 17A is a perspective view of an illustrative component on a printed circuit board showing how the component may be isolated using a groove in the circuit board and showing how conductive traces on the circuit board may be routed to the component through a gap between opposing portions of the groove in accordance with an embodiment of the present invention.

As shown in the perspective view of component 30 and board 28 of FIG. 17A, traces such as conductive printed circuit board traces 58 may be routed from component 30 to other components and circuitry on board 28 through region 38. In this type of configuration, contact pads (terminals) on component 30 may be mounted face down on portion 36 using solder balls 60.

Figure 17B:
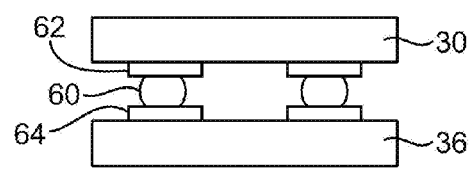
FIG. 17B is a cross-sectional side view of an illustrative component mounted on a portion of a printed circuit board using solder balls in accordance with an embodiment of the present invention.

The cross-sectional side view of FIG. 17B shows how component 30 may have contact pads 62 that correspond with mating contact pads 64 on component mounting region 36. Solder balls 60 may electrically and mechanically connect component 30 to region 36 (and thereby board 28) without the need for underfill.

Figure 18:
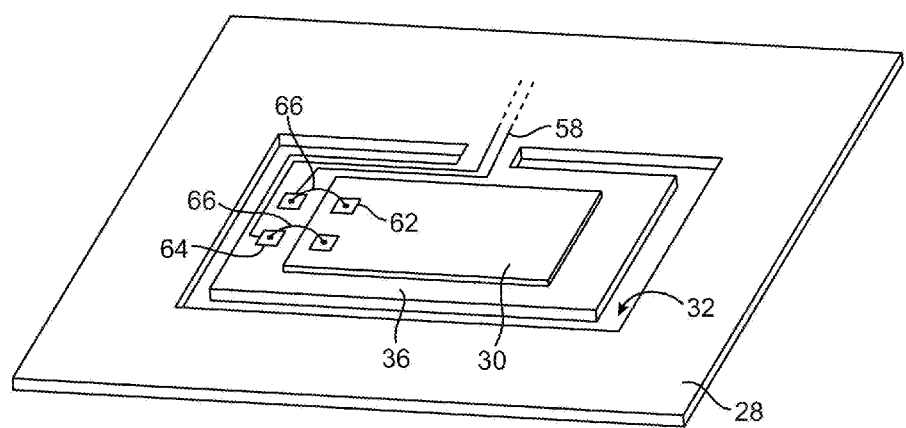
FIG. 18 is a perspective view of an illustrative component on a printed circuit board showing how the component may be isolated using a groove in the circuit board and showing how conductive wire-bond wires may be used to form electrical connections from the component to traces on the circuit board that are routed through a gap in the groove in accordance with an embodiment of the present invention.

As shown in FIG. 18, wire bonds such as wire bonds 66 may be used to connect contact pads 62 and 64. In this type of arrangement, some or all of contact pads 62 may be formed on the top (exposed) surface of component 30 rather than the bottom (face-down) surface of component 30.

Figure 19:
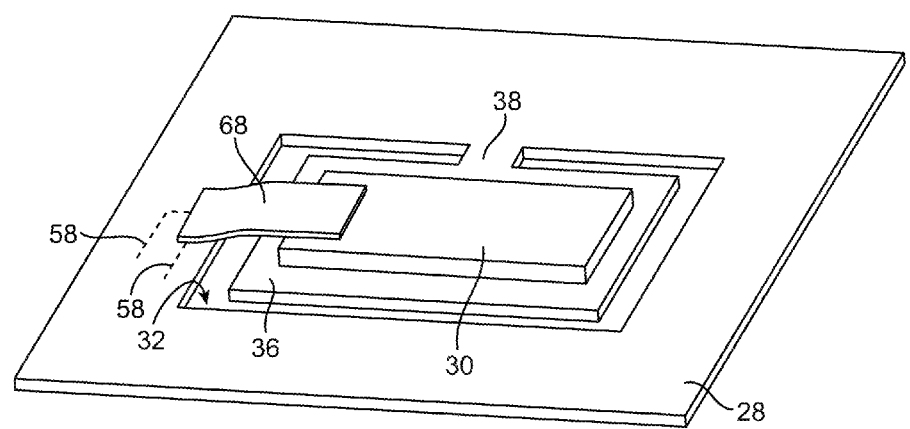
FIG. 19 is a perspective view of an illustrative component on a printed circuit board showing how the component may be isolated using a groove in the circuit board and showing how a flex circuit may be used to form electrical connections from the component to traces on the circuit board in accordance with an embodiment of the present invention.

FIG. 19 shows an illustrative configuration in which flex circuit cable 68 is used to form electrical connections between component 30 and traces 58 on board 28. Flex circuit cable 68 may bridge groove 32 and may be connected to contact pads on the top of component 30 (as shown in FIG. 19) or may be connected to contact pads formed in region 36.

Figure 20:
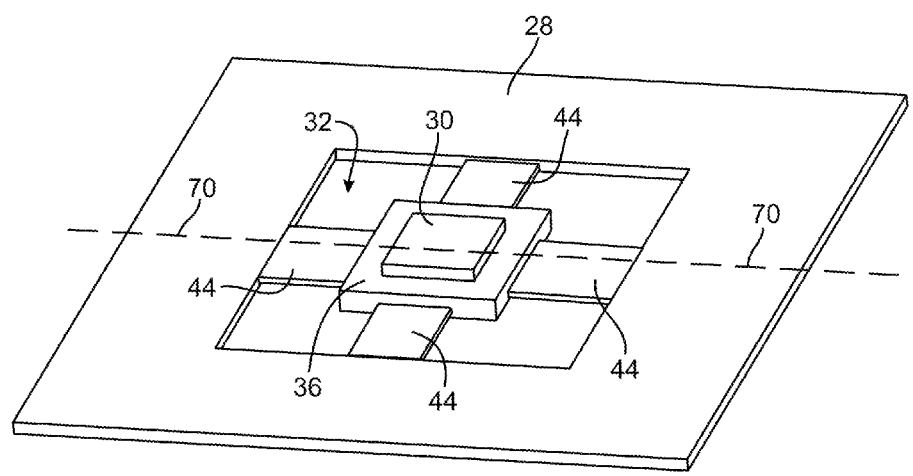
FIG. 20 is a perspective view of an illustrative printed circuit board with a hole in which a component has been mounted using a rigid flex structure having multiple flexible tails that extend into the printed circuit board in accordance with an embodiment of the present invention.

FIG. 20 is a perspective view of an illustrative component isolation configuration in which there are four flex circuit tails 44 protruding from a common rigid printed circuit board portion 36 (i.e., a rigid flex configuration). In arrangements of the type shown in FIG. 14, tails 44 are connected to contact pads on the surface of printed circuit board 28 (e.g., using conductive adhesive). In arrangements of the type shown in FIG. 20, flex circuit tails 44 may be formed as an integral portion of board 22. This type of arrangement may provide good support for component 30, while mechanically decoupling component 30 from vibrations due to the flexible nature of tails 44.

Figure 21:
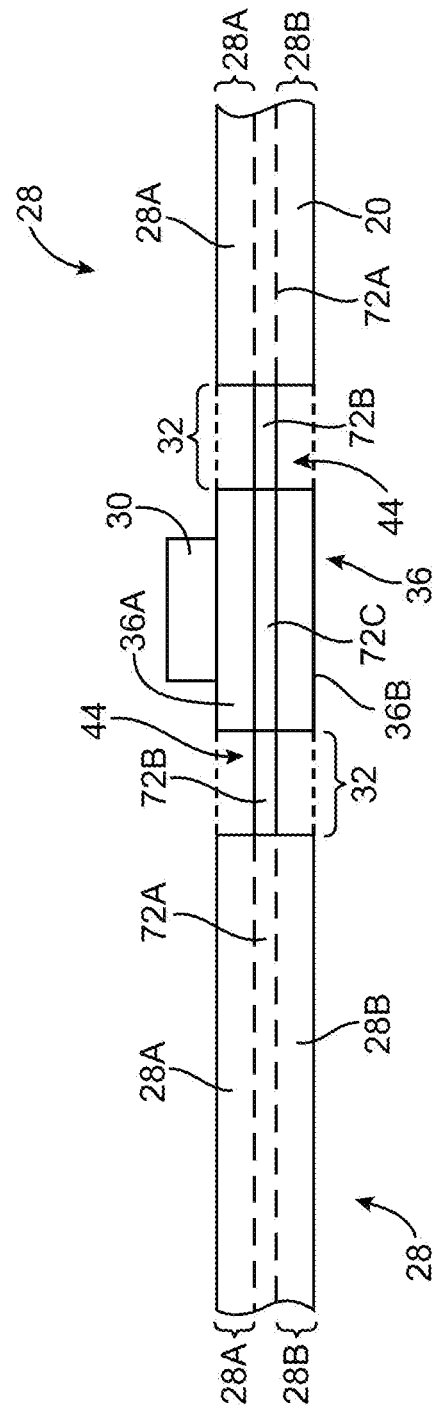
FIG. 21 is a cross-sectional side view of a component mounted in a hole in a printed circuit board using an arrangement of the type shown in FIG. 20 in accordance with an embodiment of the present invention.

A cross-sectional side view of the component isolation structures of FIG. 20 taken along line 70-70 of FIG. 20 is shown in FIG. 21. As shown in FIG. 21, a layer of flex circuit such as flex circuit based on polyimide or other flexible polymer materials may be used to bridge groove 32. In the main portions of printed circuit board 28, portion 72A of the flex circuit may be sandwiched between rigid upper printed circuit board layer 28A and rigid lower printed circuit board layer 28B. In printed circuit board region 36 (on which component 30 is mounted), portion 72C of the flex circuit may be sandwiched between rigid upper printed circuit board layer 36A and rigid lower printed circuit board layer 36B. Portions 72B of the flex circuit form tails 44 that span groove 32.

With this type of arrangement, portions 72A, 72B, and 72C are integral flex circuit regions in a single unitary piece of flex circuit material. This material is selectively mounted (sandwiched) between respective rigid printed circuit board layers that make up main board portion 28 and component mounting region 36.

Figure 22:
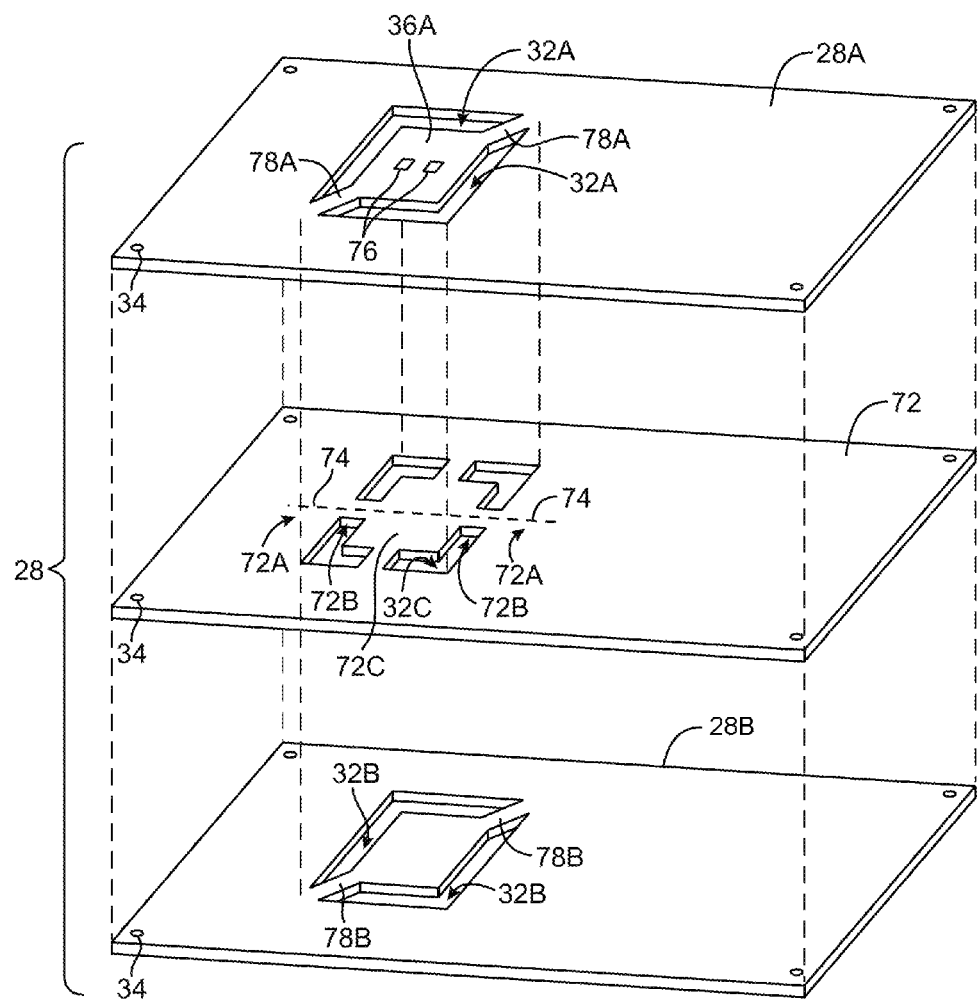
FIG. 22 is an exploded perspective view showing how component mounting structures of the type shown in FIGS. 20 and 21 can be formed from patterned layers of rigid and flexible printed circuit boards in accordance with an embodiment of the present invention.

An exploded perspective view that shows how this type of structure can be constructed from patterned layers of rigid printed circuit board material and flex circuit material is shown in FIG. 22. As shown in FIG. 22, printed circuit board 28 may be formed from an upper rigid printed circuit board layer 28A and a lower rigid printed circuit board layer 28B. A component such as component 30 (not shown in FIG. 22) may be mounted on region 36A of upper layer 28A. Layer 28A and layer 28B may be provided with grooves 32A and 32B that form groove 32 when board 28 is fully assembled. Layer 28A may be provided with breakable tabs 78A and layer 28B may be provided with breakable tabs 78B. These breakable structures may help hold regions 36A and 36B in place during assembly. Following the formation of board 28 by sandwiching flex circuit layer 72 between layers 28A and 28B, tabs 78A and 78B may be severed, thereby allowing region 36 (formed from upper layer 36A and lower layer 36B) to float free within groove 32. Flex circuit portions 72B form flex circuit tails 44 (FIG. 20) that help hold region 36 in place within groove 32. Conductive traces such as traces 74 may be interconnected to contact pads 76 on the surface of rigid upper layer 28A using conductive vias in layer 28A. Layers 28A, 72, and 28B may be connected to each other using intervening layers of adhesive (as an example).

The foregoing is merely illustrative of the principles of this invention and various modifications can be made by those skilled in the art without departing from the scope and spirit of the invention.

What is claimed is:

1. Component mounting structures for mounting an electronic component in an electronic device, comprising:
   a rigid printed circuit board, wherein the rigid printed circuit board comprises a component mounting region on which the electronic component is mounted;
   a first opening in the printed circuit board that at least partly surrounds the component mounting region, wherein the rigid printed circuit board comprises a given rigid region that at least partly surrounds the first opening;
   a second opening in the printed circuit board that at least partly surrounds the given rigid region, wherein there is only a first rigid portion of the rigid printed circuit board that extends between the component mounting region and the given rigid region and wherein there is only a second rigid portion of the rigid printed circuit board that extends between the given rigid region and the rigid printed circuit board.

2. The component mounting structures defined in claim 1 wherein the first rigid portion of the rigid printed circuit board that extends between the component mounting region and the given rigid region is located on a different side of the component mounting region than the second rigid portion of the rigid printed circuit board that extends between the given rigid region and the rigid printed circuit board.

3. The component mounting structures defined in claim 1 wherein the first opening comprises a contiguous opening that together with the first rigid portion completely surrounds the component mounting region and wherein the second opening comprises a contiguous opening that together with the second rigid portion completely surrounds the given rigid region.

4. The component mounting structures defined in claim 1, further comprising:
   a conductive trace that extends from the rigid printed circuit board, over the second rigid portion of the rigid printed circuit board that extends between the given rigid region and the rigid printed circuit board, over the first rigid portion of the rigid printed circuit board that extends between the component mounting region and the given rigid region, and onto the component mounting region.

5. Mounting structures for mounting an electronic component, comprising:
   a printed circuit board having a hole that extends through the printed circuit board;
   a component mounting region within the hole, wherein the component mounting region comprises a rigid board portion; and
   a flex circuit structure that connects the component mounting region to the printed circuit board, wherein the printed circuit board includes a rigid upper layer and a rigid lower layer, wherein at least a first portion of the flex circuit structure is sandwiched between the rigid upper layer and the rigid lower layer, wherein the component mounting region comprises a rigid upper printed circuit board layer portion and a rigid lower printed circuit board layer portion, and wherein at least a second portion of the flex circuit structure is sandwiched between the rigid upper printed circuit board layer portion and the rigid lower printed circuit board layer portion.

6. The mounting structures defined in claim 5 wherein the component mounting region comprises a rectangular rigid printed circuit board region.

7. The mounting structures defined in claim 5 wherein the component mounting region comprises a flex circuit region.

8. The mounting structures defined in claim 5 wherein the component mounting region and the flex circuit structure are both integral parts of a rigid flex structure.

* * * * *